United States Patent [19]

Lazzari

[11] 4,189,524
[45] Feb. 19, 1980

[54] STRUCTURE FOR MULTILAYER CIRCUITS

[75] Inventor: Jean-Pierre Lazzari, Montfort l'Amaury, France

[73] Assignee: Compagnie Internationale pour l'Informatique, Paris, France

[21] Appl. No.: 792,210

[22] Filed: Apr. 29, 1977

[30] Foreign Application Priority Data

May 6, 1976 [FR] France ............... 76 13553

[51] Int. Cl.² ............... G23P 3/00; B32B 13/06
[52] U.S. Cl. ............... 428/622; 29/625;
174/68.5; 428/213; 428/457; 428/448; 428/901;
428/450; 428/630
[58] Field of Search ............... 428/448, 538, 457, 901,
428/630, 450, 213, 622; 427/99, 255, 124, 294,
250, 404; 29/625; 174/68.5

[56] References Cited

U.S. PATENT DOCUMENTS

| 3,079,282 | 2/1963 | Haller et al. | 428/457 |
| 3,189,420 | 6/1965 | Gould | 174/68.5 |
| 3,357,856 | 12/1967 | Ragan et al. | 427/294 |
| 3,499,218 | 3/1970 | Dahlgren et al. | 174/68.5 |

FOREIGN PATENT DOCUMENTS 1218211  1/1971  United Kingdom .............. 29/625

*Primary Examiner*—John T. Goolkasian
*Assistant Examiner*—J. J. Gallagher
*Attorney, Agent, or Firm*—Cameron, Kerkam, Sutton, Stowell & Stowell

[57] ABSTRACT

To reduce the proportion of rejects resulting by reasons of short circuits in the manufacture and use of miniaturized multilayer circuits and to improve the electric efficiency, there is inserted between each conductive layer of low resistance and each insulating layer of high thermal stability, a very thin layer of a conductive material, preferably non-magnetic, of high resistivity and of crystallographic reference at least compatible with respect to the first conducting material and of low or negligible thermal expansion in the range of temperatures to which the circuits are submitted both during manufacture and use.

8 Claims, 3 Drawing Figures

STRUCTURE FOR MULTILAYER CIRCUITS

BACKGROUND OF THE INVENTION

The present invention has for its object an improved structure of multilayer circuits essentially useful in the technology of electric components of the type called "miniaturized".

These multilayer circuits are normally constituted of a stack of thin layers, alternately conductive and insulating, which are deposited in superposition, one atop the other, by any suitable means, such as well known chemical, aqueous, or vacuum deposition processes and all others, all such procedures coming within the realm of the invention which seeks to correct defects which occur regardless of the technology utilized for the deposition of the layers.

These thin layers may, as required, be conformed during and with respect to the production of the stack to obtain desired volumetric electric circuit configurations. The term "thin layer" is intended here in its presently accepted meaning:—layers of which the thicknesses are located from a few several hundreds of angstroms up to a small number of microns, less than 10.

A particular problem of multilayer circuits is that of short circuits which occur either during manufacture or in use. It is important since this effects not only the economics of manufacture but also the reliability of the products.

In a general way, it is desirable that the conductive layers be, in multi-layer circuits, relatively as thick as possible and the interposed insulating layers, relatively as thin as possible so that their electric efficiency is high. The short circuits appear more frequently as the insulating layers are made thinner. But it can also be stated that the frequency of short circuits increases with the thickness of the conductive layers which may require further explanation.

Whatever the technique used for deposition, the state of the surface of a conductive layer degrades as the thickness increases. The growth of crystalline nature and the mesh or size of the crystals increases rapidly with this thickness primarily under the effect of the macles or twins which are produced and the accumulation of defects in the microscopic range causing most often small crystalline growths. However, a very thin layer reproduces accurately the state of the surface of the substrate on which it is deposited. It follows that when a very thin insulating layer is formed on a relatively thick conductive layer whose surface condition is poor for the reasons above discussed, the very thin insulating layer will reproduce all of the defects of the surface of the conductive layer and will present variations of thickness leading readily to the existence of microporosities and the appearance of short circuits.

These risks of production of short circuits during manufacture therefore introduce a by no means negligible limitation on the ratios of the thicknesses of the conductive and insulating layers in multilayer circuits.

Further, multilayer circuits must often support during use of equipment in which they are incorporated large elevations of temperature which can for example reach 450° C. or thereabout. However, the conductive materials currently utilized in these circuits because they have a low resistivity, favorable to the flow of electric current, are, usually, the four metals of the group of copper, aluminum, silver and gold and their alloys. Each of these standard metals has a coefficient of its thermal expansion which is relatively large, that for copper for example being 14 $10^{-6}/°C$., and crystallize easily when the temperature increases, with grains which enlarge quickly. The lattice of the crystalline structure is therefore under considerable stresses entailing or producing the formation of fissures. Thus, a metal-insulator-metal structure can develop a short circuit when submitted to an elevation of temperature which modifies the regular crystalline structure of the metal.

The object of the invention is to eliminate the above-described difficulties and, particularly, to provide multilayer circuits with any desirable high ratio between the thicknesses of the conducting and insulating layers. The problem of the elevations of temperatures with respect to the insulating layers can be ignored since the materials usual for these insulating layers have high thermal stability at the temperatures to be considered for the efficiency of the circuits.

SUMMARY OF THE INVENTION

To these ends, the invention provides for multilayer circuits of the type above discussed a new structure essentially characterized in that it comprises between each thick layer of conductive material of low resistivity and relatively high coefficient of thermal expansion and at least the insulating layer which should separate it from the thick conductive layer following the stacking, a thin conductive layer of a conductive material having a relatively high resistivity with respect to the conductive material of low resistivity forming the conductors of the multilayer circuit, having a low thermal coefficient of expansion at least at the operating temperatures of the circuit and a crystalline lattice and size at least close to or similar to those of the conductive material of low resistivity.

The additional thin conductive layer having these properties could be deposited only on one side of the thick conductive layer, namely that side on which there will afterwards be formed a thin insulating layer in the course of deposition of the succeeding layers in the stack. It may be better for the final result to sandwich all thick conductive layers between two such additional thin layers in considering especially the point of view of heating during the use of the circuits.

The provision of these thin additional conductive layers assures that each very thin insulating layer of the stack will be deposited on a substrate of very good surface state and therefore at this level to prevent any appreciable microporosity in spite of its thickness ratio with respect to the conductive layer of low resistivity above which it is located higher than desirable for the object sought, that is the intensity of the electric current that the circuits should support during its use.

The choice of the material of the additional conductive layers assures at least and in fact reinforces the mechanical homogeneity of the multilayer because of the close crystallographic relationship between the conductive materials of the thick and thin layers. When further, the deposition process utilized requires heat, primarily in the case of evaporation under vacuum or under controlled atmosphere, the formation of an additional conductive layer thermally more stable on the crystalline plane assures to a certain degree a reduction of the macles or twins which may have occurred during the deposit of the underlying conductive layer of low resistivity. Actually, the additional material will be doped by the material of the underlying conductive layer to a certain predeterminable depth and during this dopage the superficial macles of the deposited layer will be destroyed, because their materials combine in doping with the crystals of the additional material over the said depth. Further, the interposition of the additional material has an additional advantage. Generally speaking, the conductive material of low resistivity will much more likely oxidize than the material of high resistivity forming the interposed layer. During the formation of the insulating layer, which in fact has an oxide base, in the process of deposition by evaporation under a controlled atmosphere, the oxygen utilized could and in fact does oxidize the surface of conductive layer of low resistivity. The additional layer will avoid this inconvenience.

The utilization of the sandwich form as discussed still further reduces the occurrences of the enumerated inconveniences as to the normal conductive layers of the multilayers.

When utilizing a multilayer circuit provided in accordance with the present invention subject to large heating up to, for example 450° C., the value which is taken as a limit in practice, this heating instead of being destructive of the electric insulation acts as a simple annealing reinforcing the doping and stabilizing the multilayers with respect to short circuits and with respect to further heatings. The useful thickness of the layers of low resistivity for the normal intensities of the electric currents in use with the multilayers will be evaluated as a function of a known value in the art, knowing the facility of doping of the additional material by the less stable material from the thermal point of view, thus diffusing in the additional material.

It can therefore be provided, for example, that before any delivery for use, a multilayer of the present invention will be subjected to a systematic annealing at this maximum temperature and thereafter tested. When no short circuit is then revealed, the multilayers will have a very strong probability of reliability in use.

DESCRIPTION OF THE PREFERRED EMBODIMENTS

Figure 1:
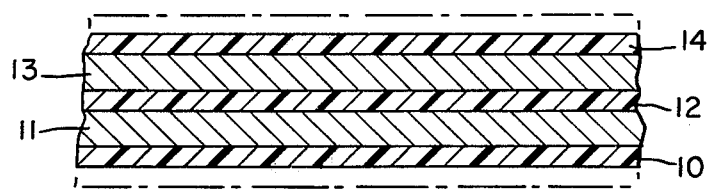
FIG. 1 is a fragmentary view, in vertical cross section, of a multi-layer structure of the type known in the prior art.

As shown in FIG. 1, a multilayer circuit of the type known in the prior art is made of alternatively depositioned layers one atop the other. After a thin film insulating layer 10 has been deposited over priorly formed layers (not shown), a conducting material layer 11, made of a material of relatively low resistivity and relatively high thermal expansion is deposited. Over this layer 11, which is thicker than the insulating film 10, there is deposited another thin film 12 of insulating material, and, thereafter, another conducting layer 13 of identical characteristics to layer 11. Over this further conducting layer 13, a further insulating film 14 is deposited; and so forth, the remaining layers of the stack not being shown. It must be understood that each insulating film is made of a refractory material such as, mainly, silica or ceramic.

The disadvantages of this conventional stack and defects resulting thereof have been hereinbefore described.

Figure 2:
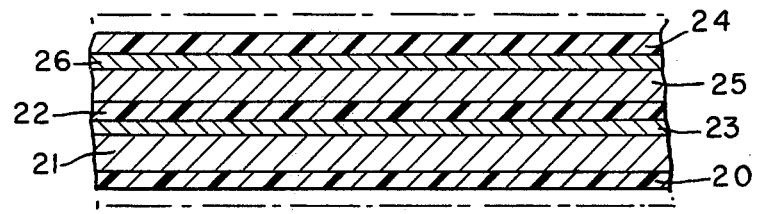
FIGS. 2 and 3 are fragmentary views, in vertical cross section, of multi-layer structures made in accordance with the present invention.
Figure 3:
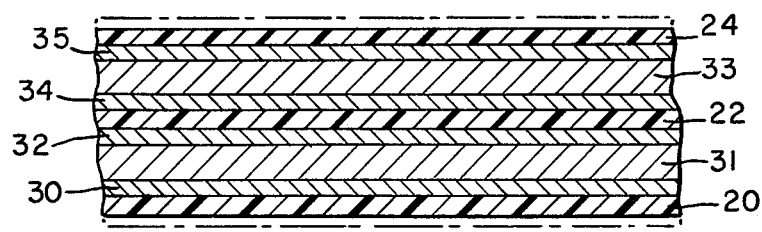

A multilayer stack made according to the teachings of the invention is shown in FIGS. 2 and 3.

In FIG. 2, between each of two insulating films 20, 22 and 22, 24, are inserted composite conducting layers, each comprised of a thicker low resistivity relatively high thermal expansion coefficient material, 21 and 25, respectively, and of a thinner layer, or film, 23 and 26, respectively, of a conducting material of relatively higher resistivity and relatively low thermal expansion coefficient. However, the materials of these two layers are so selected as to have close crystallographic characters, as it has been herein described.

In FIG. 3, between each of two insulating films 20, 22 and 22, 24, are inserted composite conducting layers, each comprised of a pair of conducting films 30, 32, respectively, and 34-35, respectively, of a relatively high resistivity and high thermal strength. Between each pair of conducting films is a thicker conducting layer 31, 33 respectively, of a material of relatively low resistivity and relatively low thermal strength, however, the materials of the said layer and films are selected to present close crystallographic characters, as herein described.

In further explanation of the invention, an example can be considered in which the conductive material having low resistivity forming the thick conductive layers is copper, the material of the additional layers is chromium and the insulating material is silica. Silica is the most common binary compound of silicon and oxygen ($Si_2O$) and an insulating refractory material. Chromium and copper have somewhat similar crystallographic characteristics. Copper crystallizes in cubic form with centered faces and chrome crystallizes in cubic form with centered bodies, the dimensions of the lattice being close in these two materials. Chromium, as known, does not expand appreciably at a temperature not above approximately 450° C. It oxidizes only little beneath this limit of temperature when heated in an oxidizing atmosphere.

Two hundred (200) specimens of multilayer circuits were formed in two series. In the first, only the usual structure was utilized, alternating regularly thick layers of copper on the order of one to four microns and thin insulating layers of silica on the order of 800 A. In the second series, the present invention was utilized by separating each thick conductive layer from each thin insulating layer by a thin layer of chromium on the order of 2000 A in thickness.

With the multilayers of the first series, the range of loss after manufacture was on the order of 8% increasing to 96% at least when then followed by an annealing of the type described above. With the multilayers of the second series the range of losses was initially on the order of 2% and was raised to only about 15% after annealing.

The above example where the materials are copper and chromium is obviously only illustrative. There is a rather large choice from the crystallographic point of view and from the electric and thermal point of view involving a certain range of limitations of choice based on the one hand on the deposition process utilized and on the other hand whether or not magnetic materials can be employed in the stack.

From this last point of view all magnetic materials which would otherwise be useful—beta cobalt, nickel, for example, will be eliminated except to assure during manufacture a dopage such that the final form would be non-magnetic when required, by introduction of an additional doping element assuring such a transformation.

To manufacture multilayer circuits by application of evaporation in a controlled atmosphere, there will be eliminated bodies which evaporate badly; primarily the metalloids such as strontium, calcium, thallium, rhodium whose other characteristics of which would be compatible with the manufacture of the invention by other deposit procedures.

After the application of the elimination criteria set forth above, only simple crystalline bodies which crystallize similar to copper remain, such as, for example, chrome, titanium deposited in beta form and vanadium and their alloys, or from that formed by nickel and beta cobalt doped with the first material, for a fabrication which relies on evaporation in a controlled atmosphere and where copper is the normal conductive material in the multilayers.

On the other hand, the use of aluminum for the material of low resistivity becomes easy since, when covered with thin additional layers of the invention, it does not oxidize during the deposit of silica, whereas previously oxidizing made its use difficult.

It should be noted that the use of bodies or alloys of similar crystallography, but not identical to that of the materials of low resistivity is made possible because, by evaporation under vacuum, at least, the well known phenomena of epitaxy comes into action in the deposit of thin layers, a phenomena which tens to cause the newly evaporated substance to "copy" the lattice of the substance which constitutes the substrate for it.

The thicknesses of the additional layers need not in practice of the invention be greater than 5000 A, any more than the thicknesses of the insulating layers had, or still have, any need to be as much as a micron, since the thickness of the layers are not critical, it is obviously desirable to avoid the dissipation of the materials in industrial manufacture.

I claim:

1. A multilayer circuit adapted to withstand temperature elevations of up to 450° C. consisting essentially of a plurality of thin alternating conductive layers stacked with intervening thinner insulating layers of refractory material, said alternating layers being deposited one atop the other, each of the thin conductive layers in turn comprising between a lower thinner insulating layer and an upper thinner insulating layer a thin composite layer consisting of a first layer of a first conductive material of low resistivity and appreciable thermal expansion at said elevated temperatures selected from the group consisting of copper, aluminum, silver, gold and their alloys, and at least one thinner second conductive layer of a second conductive material directly contacting said first layer and being of appreciably higher resistivity and virtually negligible thermal expansion at said elevated temperatures and selected from the group consisting of chromium, beta titanium, vanadium and their alloys or from that formed by nickel and beta cobalt doped with the first material and/or a complementary material which inhibits their magnetic properties, the crystallographic references of said first and second conductive materials being intrinsically and/or epitaxially compatible as regards crystal lattices and crystal size.

2. A multilayer circuit according to claim 1 wherein said thin composite layer includes a third conductive layer of said second conductive material, said first layer of the first conductive material being sandwiched between the second and the third of the second conductive material thinner layers which contact respectively, the upper and lower insulating layers.

3. A multilayer circuit according to claim 1 wherein the insulating material is silica.

4. A multilayer circuit according to claim 2 wherein the insulating material is ceramic and is virtually insensitive to variations in elevations of temperature in the operative range.

5. A multilayer device adapted to withstand temperature elevations up to 450° C. without substantial risk of formation of short-circuits between thin conducting layers thereof separated by thinner intervening insulating layers; consisting essentially of a plurality of thin conductive layers stacked with intervening thin layers of insulating refractory material, each conductive layer comprising a composite of a first layer and a second conductive layer, said first layer having a relatively low resistivity and appreciable thermal expansion coefficient and having one face in contact with one face a first thin insulating material layer and its other face in contact with said second layer, said second layer being a thinner layer of a conductive material having a relatively high resistivity, a negiligible thermal expansion coefficient and having a crystalline structure closely compatible to the crystalline structure of the first layer as regards lattices and crystal sizes and said second layer being in contact with one face of a second thin insulating material layer.

6. A multilayer device according to claim 5, wherein the material of said first layer is doped at least partly with the material of said thinner conducting second layer.

7. Device according to claim 5, wherein the material of said thinner conducting second layer is doped by the material of the said first layer.

8. Device according to claim 7, wherein the material of the said thinner second layer is selected in the group formed by nickel and beta cobalt and is doped by a material selected in the group formed by copper, aluminum, silver and gold.

* * * * *

UNITED STATES PATENT AND TRADEMARK OFFICE
CERTIFICATE OF CORRECTION

PATENT NO. : 4,189,524
DATED : February 19, 1980
INVENTOR(S) : LAZZARI, Jean-Pierre It is certified that error appears in the above-identified patent and that said Letters Patent are hereby corrected as shown below:

In item [73] "Compagnie Internationale pour l'Informatique" should be -- Compagnie Internationale pour L'Informatique Cii-Honeywell Bull (Societe Anonyme) --.

Signed and Sealed this

Seventh Day of April 1981

[SEAL]

Attest:

RENE D. TEGTMEYER

Attesting Officer

Acting Commissioner of Patents and Trademarks

UNITED STATES PATENT AND TRADEMARK OFFICE
CERTIFICATE OF CORRECTION

PATENT NO. : 4,189,524

DATED : February 19, 1980

INVENTOR(S) : Jean-Pierre LAZZARI

It is certified that error appears in the above-identified patent and that said Letters Patent is hereby corrected as shown below:

Claim 8, lines 2 and 4, change "in" to --from--.

Signed and Sealed this

Fifth Day of March 1985

[SEAL]

Attest:

DONALD J. QUIGG

Attesting Officer     Acting Commissioner of Patents and Trademarks